United States Patent [19]
Trask

[11] Patent Number: 6,140,849
[45] Date of Patent: Oct. 31, 2000

[54] ACTIVE DOUBLE-BALANCED MIXER WITH EMBEDDED LINEARIZATION AMPLIFIERS

[76] Inventor: Christopher Trask, 1863 E. Palmcroft Dr., Tempe, Ariz. 85282-2858

[21] Appl. No.: 09/130,740

[22] Filed: Aug. 7, 1998

[51] Int. Cl.[7] .................................................. H03B 19/00
[52] U.S. Cl. .......................... 327/113; 445/326; 445/237; 445/321
[58] Field of Search .................................... 455/326, 330, 455/333, 343, 318, 319, 320, 341; 327/113, 355, 359

[56] References Cited

U.S. PATENT DOCUMENTS

| | | |
|---|---|---|
| 2,337,965 | 12/1943 | Bode . |
| 3,100,877 | 8/1963 | Maupin . |
| 3,241,078 | 3/1966 | Jones . |
| 3,493,882 | 2/1970 | Seader et al. . |
| 3,689,752 | 9/1972 | Gilbert . |
| 4,485,359 | 11/1984 | Talbot ........................................ 332/31 |
| 5,532,637 | 7/1996 | Khoury et al. . |
| 5,548,840 | 8/1996 | Heck . |
| 5,867,778 | 2/1999 | Khoury et al. ........................... 455/333 |

OTHER PUBLICATIONS

Bilotti, Albert, "Applications of a Monolithic Analog Multiplier," IEEE Journal of Solid–State Circuits, vol. SC–3, No. 4, Dec. 1968, pp. 373–380.

Chadwick, Peter G., "The SLG400 High Performance Integrated Circuit Mixer," Wescon 81 Conference Record, Session 24, No. 2, pp. 1–9.

Gilber, Barrie, "A Precise Four Quadrant Multiplier with Subnanosecond Response," IEEE Journal of Solid–State Circuits, vol. SC–3, No. 4, Dec. 1968, pp. 365–373.

Gilbert, Barrie, "The Micromixer: A Highly Linear Variant of the Gilbert Mixer Using A Bisymmetric Class–AB Input Stage," IEEE Journal of Solid–State Circuits, Sep. 1997, pp. 1412–1423.

Meyer, R.G., R. Eschenbach, and R. Chen, "Wide–Band Ultra–Linear Amplifier From 3 to 300 MHz," IEEE Journal of Solid–State Circuits, vol. SC–9, No. 4, Aug. 1974, pp. 167–175.

Sartorf, Eugene F., "Hibrid Transformers," IEEE Transactions on Parts, Materials, and Packaging, vol. PMP–4, No. 3, Sep. 1968, pp. 59–66.

Trask, Christopher, "Feedback Technique Improves Active Mixer Performance," RF Design, Sep. 1997, pp. 46–52.

*Primary Examiner*—Timothy P. Callahan
*Assistant Examiner*—Hiep Nguyen

[57] ABSTRACT

A linearized double-balanced active mixer circuit is described, including a first input for a local oscillator (LO), a second input for an intermediate frequency (IF) signal, and an output for a resulting product radio frequency (RF) signal. The mixer circuit also includes a feedback circuit, along with a pair of operational amplifiers, for the purpose of improving the intermodulation (IM) performance. According to a further embodiment, the mixer circuit includes a series-shunt feedback amplifier in place of the operational amplifier, and a further embodiment includes an additional pair of transistors to further improve the IM performance. The output of the mixer circuit includes a signal combining circuit, composed of either a network of resistors having two output terminals, or two transformers having a common output terminal.

10 Claims, 8 Drawing Sheets

6,140,849

ACTIVE DOUBLE-BALANCED MIXER WITH EMBEDDED LINEARIZATION AMPLIFIERS

BACKGROUND OF THE INVENTION

Mixers are used in communications circuits for the purpose of generating a modulated carrier for transmission, demodulating a modulated carrier in reception, or converting a signal at some input intermediate frequency (IF) to another output radio frequency (RF) by multiplying two input signals and thereby generating a third. A number of mixer realizations, both passive and active, are known in the art, and double-balanced mixers are known particularly well due to their advantages in the suppression of unwanted spurious signals and the isolation of any one of three ports to the other two, there generally being two inputs and one output. The Gilbert Cell has been the most widely used active mixer circuit for performing the above tasks, usually incorporated within an integrated circuit. It does, however, possess certain limitations in terms of intermodulation distortion that precludes it's use in communications systems having demanding performance specifications.

Referring to FIG. 1, a schematic diagram of a Gilbert cell mixer is shown in one of many known topologies. Here, the mixer is comprised of transistors 101, 102, 104, and 105, which are turned on (saturation) and off (cutoff) alternately by a differentially applied local oscillator (LO) signal. By this switching action, a pair of currents generated by transistors 103 and 106 are divided into four paths, there being two paths for each of two currents. The currents generated by transistors 103 and 106 are the result of an input intermediate frequency (IF) signal applied differentially across their respective base connections and the emitter resistors 109 and 110. The current source I11 serves to establish the quiescent bias condition of the mixer, and the resistors 109 and 110, in conduction with the incremental emitter resistances $r_e$ of transistors 103 and 106, and the load resistors 107 and 108, serve to establish the conversion gain. Those familiar with the art readily understand the signal-handling limitations of the Gilbert cell, the performance variations over temperature due to the temperature dependency of $r_e$, and the other tradeoffs necessary in order to meet system design requirements of noise, intermodulation (IM), power consumption, and gain stability over temperature. It has long been desireable that a Gilbert cell mixer be available that has improved IM and temperature performance without the expense of added power.

In an ettempt to reduce the intermodulation distortion of the Gilbert Cell mixer, Heinz et al, in U.S. Pat. No. 5,410,744 entitled "HF Mixer Stage having a Common Base Circuit", applied the input baseband signal to the driver transistors (items T1 and T2) at their emitter terminals, a method known to the art as common-base, thus increasing the large-signal behavior and therefore the dynamic range and intermodulation performance. This method does not, however, account for the nonlinear characteristics of the incremental emitter resistance $r_e$ of the driver transistors, a significant source of intermodulation distortion, nor does it account for the nonlinearities of the four switching transistors (items T3, T4, T5, and T6). Furthermore, this method does not address the temperature dependency of the incremental emitter resistance $r_e$, therefore offering little or no improvement in the temperature performance.

In a further attempt to reduce the intermodulation distortion of the Gilbert Cell mixer, Heck, in U.S. Pat. No. 5,548,840 entitled "Balanced Mixer Circuit with Improved Linearity", describes a Gilbert Cell mixer to which has been added a pair of transconductance amplifiers, each of which is used to ensure that the current passing through the resistors R1 (items 322 and 324) is a faithful reproduction of the applied input IF signal. The method does not, however, account for the nonlinearities of the small-signal gain of the driver transistors (items 314 and 316), nor still does it account for the nonlinearities of the four switching transistors (items 306, 308, 310, and 312). It does, however, offer a considerable advantage in temperature performance over other methods.

In his paper "The SL6400 High Performance Integrated Circuit Mixer," Peter Chadwick properly recognizes that the intermodulation in the Gilbert Cell mixer (referred to by Chadwick as a transistor tree mixer) is caused by the nonlinearity of the voltage to current conversion in the driver (signal input) transistors. He then describes a Gilbert Cell mixer in which the driver transistors have been replaced with linearizing amplifiers, each consisting of an NPN and a PNP transistor. This method provides a good improvements in linearity and temperature, but at the expense of considerable power consumption.

It is the purpose of this invention to address the above sources of distortion and temperature variation, and to therefore provide an active mixer of markedly improved performance, while at the same time conserving power consumption and retaining an overall sense of simplicity and cost effectiveness.

SUMMARY OF THE INVENTION

A linearized double-balanced active mixer circuit with improved intermodulation (IM) performance is described which includes a pair of linearized balanced active mixer circuits, each of which includes a differential pair of switching transistors which divide a controlled current into two paths at a rate determined by an input local oscillator (LO) signal, creating an output radio frequency (RF) signal. A third driver transistor in each linearized balanced active mixer circuit provides the controlled current, which is determined by an input intermediate frequency (IF) signal. Each linearized double-balanced active mixer circuit further includes an output signal combining network, comprised of either a network of resistors or a pair of center-tapped transformer primary windings, connected across the collectors of the differential transistor pairs, effectively cancelling both the output LO and RF signals and recombining the amplified IF signal. An operational amplifier compares the amplified IF signal with the input IF signal, amplifying the difference as a voltage to the driver transistor, thereby completing a feedback amplifier circuit and in turn improving the linearity and IM performance of the mixer circuit. In a further embodiment suitable for higher frequency applications, resistors are used in combination with the driver transistors to form a pair of series/shunt feedback amplifiers for which the recombined amplified IF signal is the output and the input IF signal is the input, improing the IM performance of the linearized balanced active mixer circuits. An additional transistor and resistor are later added to improve the IM performance still further. The two linearized balanced active mixer circuits are interconnected to improve the balance and overall performance of the linearized double-balanced active mixer circuit. An output signal combiner, consisting of either a network of resistors resistors or a pair of transformer secondary windings, is connected between the linearized balanced active mixers, cancelling the output LO and IF signals and providing an output RF signal.

BRIEF DESCRIPTION OF THE DRAWINGS

The invention is described in the schematics of FIGS. 1 to 8, in which.

DETAILED DESCRIPTION OF THE PREFERRED EMBODIMENT

Designers of radio communication transmitters and receivers are always concerned with elements of system performance which includes, but is not limited to, intermodulation distortion (IM), noise, and power consumption. Historically, the IM performance is improved by methods that invariably require additional power consumption. Amplification stages with feedback methods are widely used as they offer far better IM performance while consuming less power than those not employing feedback. This invention now presents a mixer circuit which achieves a markedly improved IM performance without excessive power consumption by applying a feedback method widely used in amplifier design.

Figure 1:
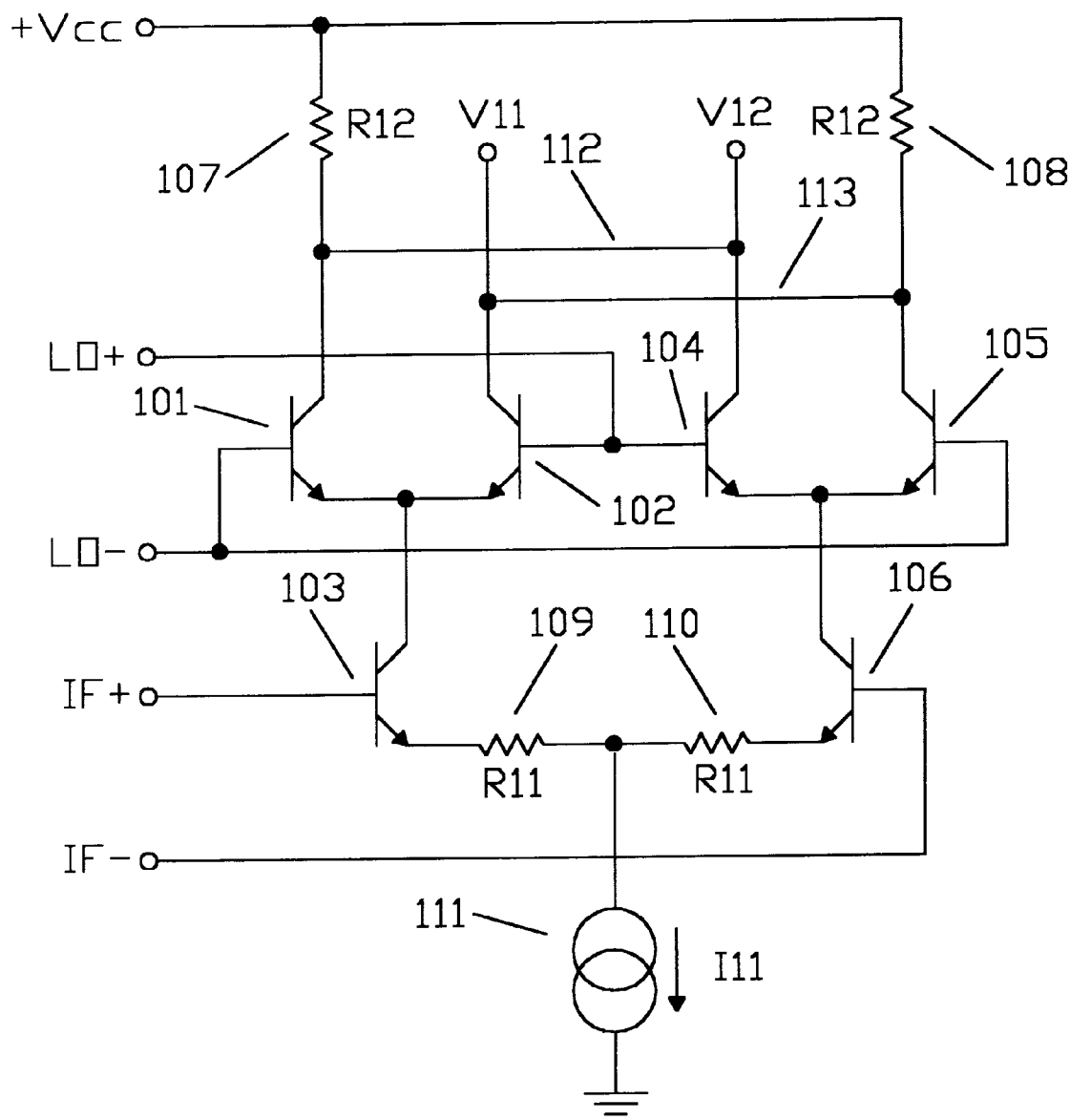
FIG. 1 schematically illustrates the existing prior art, commonly referred to as a Gilbert Cell.

Referring to FIG. 1, the Gilbert Cell is shown in its most basic form. Here, the biasing current source 111, having a current of I11, is divided equally between the two driver transistors 103 and 106. An input intermediate frequency (IF) signal, having an amplitude of ±A and a frequency of $\omega_S$, is applied differentially to the base terminals of driver transistors 103 and 106, producing the respective collector currents IC103 and IC106:

$$I_{C103} = (I_{11}/2) + A \times \text{Cos } \omega_S t/(R_{11}+r_e) \quad (1)$$

$$I_{C106} = (I_{11}/2) - A \times \text{Cos } \omega_S t/(R_{11}+r_e) \quad (2)$$

where $r_e$ is the nonlinear incremental emitter resistance for the driver transistors 103 and 106, and is assumed to be equal for both devices. These controlled currents are now connected to the common emitter junctions of the first differential transistor pair 101 and 102, and the second differential transistor pair 104 and 105, respectively. An input local oscillator (LO) signal is applied differentially to the base terminals of these transistor pairs, at a frequency of $\omega_L$ and at an amplitude that is sufficient to cause these transistor pairs to be alternately "on" and "off", the "on" state being a condition at which the transistor appears to be of very low resistance (saturation), and the "off" state at which the transistor appears to be of a very high resistance (cutoff), between it's collector and emitter terminals. Those familiar with the art will recognize that this switching creates a square-wave modulation of the emitter current, but that it is customary to consider only the first term of the resulting modulation and to disregard the remaining terms as being spurious signals. Thus, the resulting four collector currents for transistors 101, 102, 104, and 105 are, respectively, $$\begin{aligned}
I_{C101} &= I_{C103} \times (1 - \text{Cos}\,\omega_L t)/2 \\
&= (I_{11}/4) + A \times \text{Cos}\,\omega_S t/[2 \times (R_{11}+r_e)] - \\
&\quad (I_{11} \times \text{Cos}\,\omega_L t/4) - \\
&\quad A \times [\text{Cos}(\omega_S - \omega_L)t + \text{Cos}(\omega_S + \omega_L)t]/[4 \times (R_{11}+r_e)]
\end{aligned} \quad (3)$$

$$\begin{aligned}
I_{C102} &= I_{C103} \times (1 + \text{Cos}\,\omega_L t)/2 \\
&= (I_{11}/4) + A \times \text{Cos}\,\omega_S t/[2 \times (R_{11}+r_e)] + \\
&\quad (I_{11} \times \text{Cos}\,\omega_L t/4) + \\
&\quad A \times [\text{Cos}(\omega_S - \omega_L)t + \text{Cos}(\omega_S + \omega_L)t]/[4 \times (R_{11}+r_e)]
\end{aligned} \quad (4)$$

$$\begin{aligned}
I_{C104} &= I_{C106} \times (1 + \text{Cos}\,\omega_L t)/2 \\
&= (I_{11}/4) - A \times \text{Cos}\,\omega_S t/[2 \times (R_{11}+r_e)] + \\
&\quad (I_{11} \times \text{Cos}\,\omega_L t/4) - \\
&\quad A \times [\text{Cos}(\omega_S - \omega_L)t + \text{Cos}(\omega_S + \omega_L)t]/[4 \times (R_{11}+r_e)]
\end{aligned} \quad (5)$$

$$\begin{aligned}
I_{C105} &= I_{C106} \times (1 - \text{Cos}\,\omega_L t)/2 \\
&= (I_{11}/4) - A \times \text{Cos}\,\omega_S t/[2 \times (R_{11}+r_e)] - \\
&\quad (I_{11} \times \text{Cos}\,\omega_L t/4) + \\
&\quad A \times [\text{Cos}(\omega_S - \omega_L)t + \text{Cos}(\omega_S + \omega_L)t]/[4 \times (R_{11}+r_e)]
\end{aligned} \quad (6)$$

The collector currents IC101 and IC104 are combined, producing an output voltage of:

$$\begin{aligned}
V_{12} &= V_{CC} - (I_{C101} + I_{C104}) \times R_{12} \\
&= V_{CC} - (R_{12} \times I_{11}/2) - \\
&\quad A \times R_{12} \times [\text{Cos}(\omega_S - \omega_L)t + \\
&\quad \text{Cos}(\omega_S + \omega_L)t]/[2 \times (R_{11}+r_e)]
\end{aligned} \quad (7)$$

and the collector currents IC102 and IC105 are also combined, producing an output voltage of:

$$\begin{aligned}
V_{11} &= V_{CC} - (I_{C102} + I_{C105}) \times R_{12} \\
&= V_{CC} - (R_{12} \times I_{11}/2) + \\
&\quad A \times R_{12} \times [\text{Cos}(\omega_S - \omega_L)t + \\
&\quad \text{Cos}(\omega_S + \omega_L)t]/[2 \times (R_{11}+r_e)]
\end{aligned} \quad (8)$$

Note that in EQ. 7 the LO and IF terms of EQ. 3 and EQ. 5 cancelled, and that in EQ. 8 the LO and IF terms of EQ. 4 and EQ. 6 have been cancelled, effectiveley reducing the differential RF output to the desired RF mixing products and a quiescent DC term.

Figure 2:
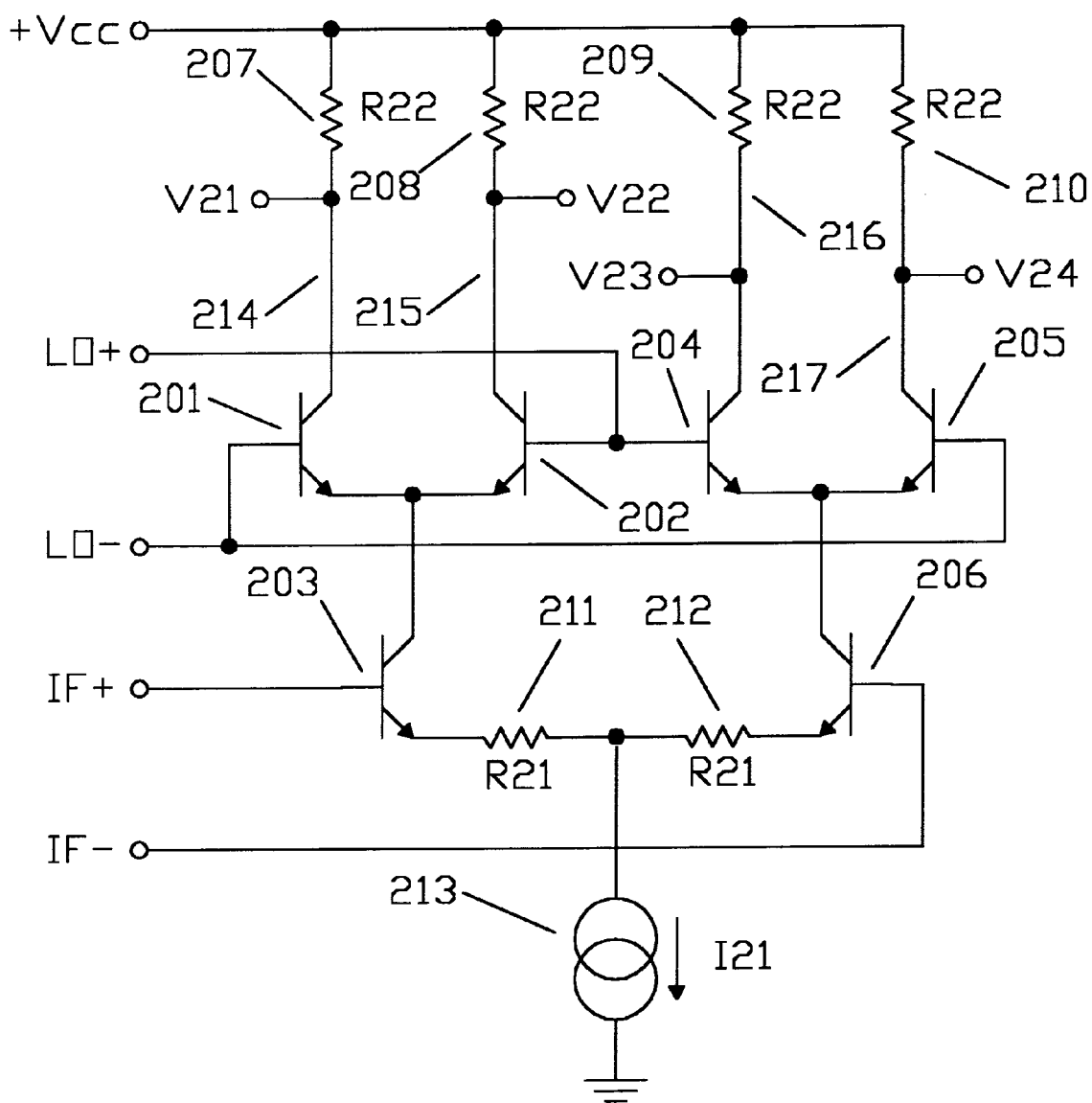
FIG. 2 schematically illustrates the Gilbert Cell of FIG. 1 as a further development of a linearized double-balanced active mixer.

Referring to FIG. 2, the Gilbert Cell mixer of FIG. 1 is first modified by disconnecting the collectors of transistors 101 (now 201) and 104 (now 204) and transistors 102 (now 202) and 105 (now 205) and connecting each collector to a separate load resistor 207, 209, 208, and 210, respectively, all of which have a value of R22, each of which is then connected to a supply voltage Vcc. In a similar development as with FIG. 1, the collector currents $I_{C203}$ and $I_{C206}$ can be approximated as being as being:

$$I_{C203}=(I_{21}/2)+A\times\text{Cos }\omega_S t/(R_{21}+r_e) \quad (9)$$

$$I_{C206}=(I_{21}/2)-A\times\text{Cos }\omega_S t/(R_{21}+r_e) \quad (10)$$

and the resulting four collector currents for transistors 201, 202, 204, and 205 are, respectively, $$\begin{aligned}I_{C201} &= I_{C203}\times(1-\text{Cos}\,\omega_L t)/2 \\&= (I_{21}/4) + A\times\text{Cos}\,\omega_S t/[2\times(R_{21}+r_e)] - \\&\quad (I_{21}\times\text{Cos}\,\omega_L t/4) - A\times[\text{Cos}(\omega_S-\omega_L)t + \\&\quad \text{Cos}(\omega_S+\omega_L)t]/[4\times(R_{21}+r_e)]\end{aligned} \quad (11)$$

$$\begin{aligned}I_{C202} &= I_{C203}\times(1+\text{Cos}\,\omega_L t)/2 \\&= (I_{21}/4) + A\times\text{Cos}\,\omega_S t/[2\times(R_{21}+r_e)] + \\&\quad (I_{21}\times\text{Cos}\,\omega_L t/4) + A\times[\text{Cos}(\omega_S-\omega_L)t + \\&\quad \text{Cos}(\omega_S+\omega_L)t]/[4\times(R_{21}+r_e)]\end{aligned} \quad (12)$$

$$\begin{aligned}I_{C204} &= I_{C206}\times(1+\text{Cos}\,\omega_L t)/2 \\&= (I_{21}/4) - A\times\text{Cos}\,\omega_S t/[2\times(R_{21}+r_e)] + \\&\quad (I_{21}\times\text{Cos}\,\omega_L t/4) - A\times[\text{Cos}(\omega_S-\omega_L)t + \\&\quad \text{Cos}(\omega_S+\omega_L)t]/[4\times(R_{21}+r_e)]\end{aligned} \quad (13)$$

$$\begin{aligned}I_{C205} &= I_{C206}\times(1-\text{Cos}\,\omega_L t)/2 \\&= (I_{21}/4) - A\times\text{Cos}\,\omega_S t/[2\times(R_{21}+r_e)] - \\&\quad (I_{21}\times\text{Cos}\,\omega_L t/4) + A\times[\text{Cos}(\omega_S-\omega_L)t + \\&\quad \text{Cos}(\omega_S+\omega_L)t]/[4\times(R_{21}+r_e)]\end{aligned} \quad (14)$$

and the resulting four collector voltages at 214, 215, 216, and 217 are, respectively:

$$\begin{aligned}V_{21} &= V_{CC} - R_{22}\times I_{C201} \\&= V_{CC} - R_{22}\times I_{21}/4 - \\&\quad R_{22}\times A\times\text{Cos}\,\omega_S t/[2\times(R_{21}+r_e)] + \\&\quad R_{22}\times I_{21}\times\text{Cos}\,\omega_L t/4) + R_{22}\times A\times[\text{Cos}(\omega_S-\omega_L)t + \\&\quad \text{Cos}(\omega_S+\omega_L)t]/[4\times(R_{21}+r_e)]\end{aligned} \quad (15)$$

$$\begin{aligned}V_{22} &= V_{CC} - R_{22}\times I_{C202} \\&= V_{CC} - R_{22}\times I_{21}/4 - \\&\quad R_{22}\times A\times\text{Cos}\,\omega_S t/[2\times(R_{21}+r_e)] - \\&\quad R_{22}\times I_{21}\times\text{Cos}\,\omega_L t/4) - R_{22}\times A\times[\text{Cos}(\omega_S-\omega_L)t + \\&\quad \text{Cos}(\omega_S+\omega_L)t]/[4\times(R_{21}+r_e)]\end{aligned} \quad (16)$$

$$\begin{aligned}V_{23} &= V_{CC} - R_{22}\times I_{C204} \\&= V_{CC} - R_{22}\times I_{21}/4 - \\&\quad R_{22}\times A\times\text{Cos}\,\omega_S t/[2\times(R_{21}+r_e)] - \\&\quad R_{22}\times I_{21}\times\text{Cos}\,\omega_L t/4) + R_{22}\times A\times[\text{Cos}(\omega_S-\omega_L)t + \\&\quad \text{Cos}(\omega_S+\omega_L)t]/[4\times(R_{21}+r_e)]\end{aligned} \quad (17)$$

$$\begin{aligned}V_{24} &= V_{CC} - R_{22}\times I_{C205} \\&= V_{CC} - R_{22}\times I_{21}/4 + \\&\quad R_{22}\times A\times\text{Cos}\,\omega_S t/[2\times(R_{21}+r_e)] + \\&\quad R_{22}\times I_{21}\times\text{Cos}\,\omega_L t/4) - R_{22}\times A\times[\text{Cos}(\omega_S-\omega_L)t + \\&\quad \text{Cos}(\omega_S+\omega_L)t]/[4\times(R_{21}+r_e)]\end{aligned} \quad (18)$$

Upon close examination, EQ. 15 and EQ. 16, and EQ. 17 and EQ. 18 above contain both even- and odd-ordered terms which, if we were to add them together as pairs, we would arrive at the following two voltages:

$$\begin{aligned}V_{25} &= V_{21} + V_{22} \\&= V_{CC} - R_{22}\times I_{21}/2 - \\&\quad R_{22}\times A\times\text{Cos}\,\omega_S t/[2\times(R_{21}+r_e)]\end{aligned} \quad (19)$$

$$\begin{aligned}V_{26} &= V_{23} + V_{24} \\&= V_{CC} - R_{22}\times I_{21}/2 + \\&\quad R_{22}\times A\times\text{Cos}\,\omega_S t/[2\times(R_{21}+r_e)]\end{aligned} \quad (20)$$

which are simple amplifications of the input IF signal plus a quiescent DC term. Further examination shows that EQ. 15 and EQ. 17, and EQ. 16 and EQ. 18 also contain both even- and odd-ordered terms which again, if we were to add them together as pairs, we would arrive at the additional two voltages:

$$\begin{aligned}V_{27} &= V_{21} + V_{23} \\&= V_{CC} - R_{22}\times I_{21}/2 + R_{22}\times A\times[\text{Cos}(\omega_L-\omega_S)t + \\&\quad \text{Cos}(\omega_L+\omega_S)t]/[2\times(R_{21}+r_e)]\end{aligned} \quad (21)$$

$$\begin{aligned}V_{28} &= V_{22} + V_{24} \\&= V_{CC} - R_{22}\times I_{21}/2 - R_{22}\times A\times[\text{Cos}(\omega_L-\omega_S)t + \\&\quad \text{Cos}(\omega_L+\omega_S)t]/[2\times(R_{21}+r_e)]\end{aligned} \quad (22)$$

which are the desired RF mixing products plus a quiescent DC term. The summations of EQ. 19 and EQ. 20 can be easily performed by connecting two resistors of equal value in series between the collectors of transistors 201 and 202, and transistors 204 and 205, forming the summation voltages V25 and V26 at their respective junctions, although at half the amplitude. In a similar manner the summations of EQ. 21 and EQ. 22 can be performed with equal ease by connecting two resistors of equal value in series between the collectors of transistors 201 and 204, and transistors 202 and 205, forming the summation voltages V27 and V28 at their respective junctions, again at half the amplitude.

Figure 3:
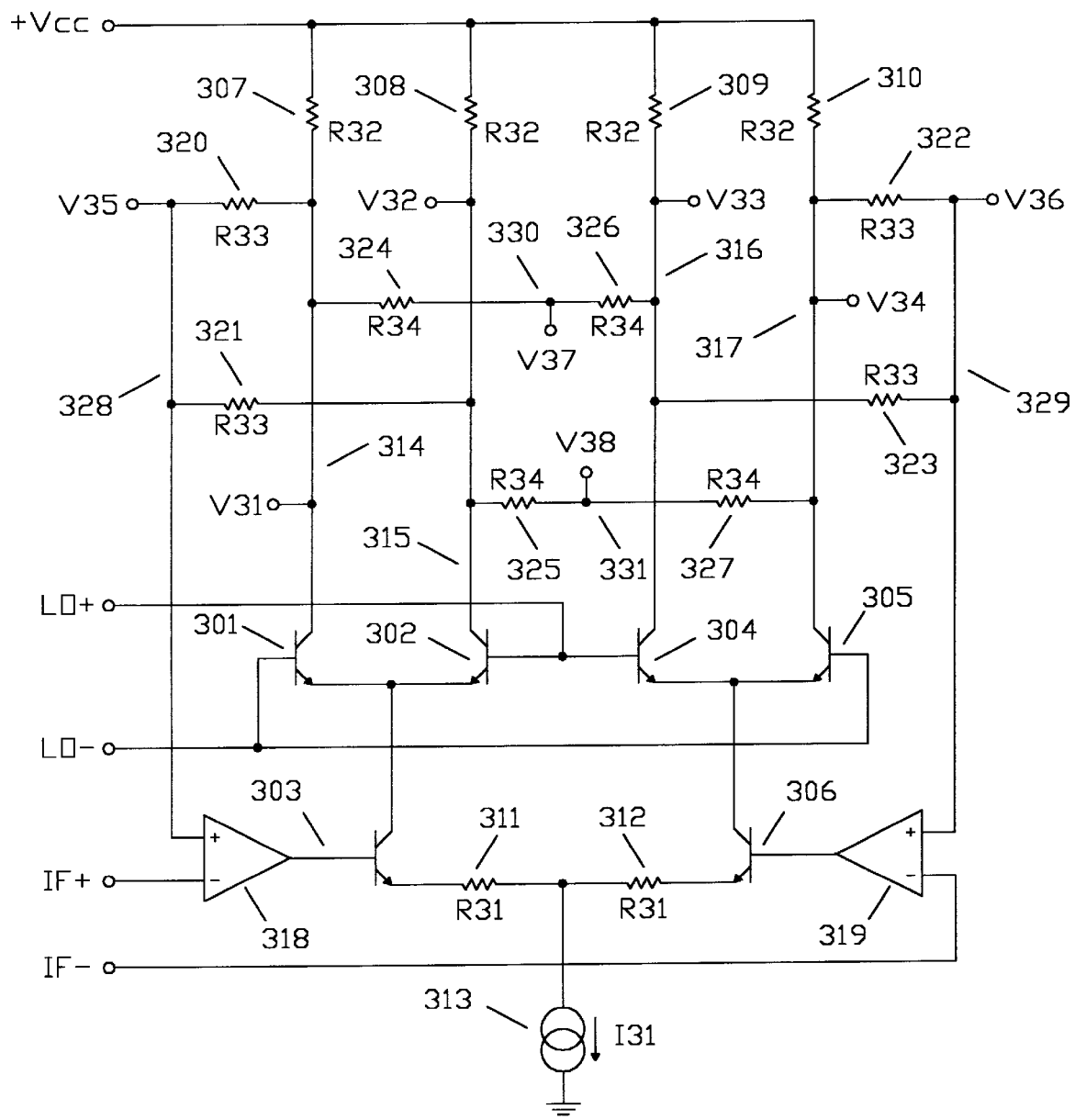
FIG. 3 schematically illustrates the addition of a pair of operational amplifiers, resistive feedback combiners, and resistive output combiners in the linearized double-balanced active mixer of FIG. 2.

FIG. 3 depicts such a circuit, where the following voltage relationships apply:

$$V_{35}=(V_{31}+V_{32})/2 \quad (23)$$

$$V_{36}=(V_{33}+V_{34})/2 \quad (24)$$

$$V_{37}=(V_{31}+V_{33})/2 \quad (25)$$

$$V_{38}=(V_{32}+V_{34})/2 \quad (26)$$

The operational amplifiers 318 and 319, seeing the differential input signal at their inverting inputs and the voltages V35 and V36 at their respective non-inverting inputs, will force the AC component of these two voltages to be equal to the differential input voltages:

$$V_{35}=+A\times\text{Cos }\omega_S t \quad (27)$$

$$V_{36}=-A\times\text{Cos }\omega_S t \quad (28)$$

Now, by comparing EQ. 27 and EQ. 28 with EQ. 19 and EQ. 20, and then with EQ. 15, EQ. 16, EQ. 17, and EQ. 18, we can see that:

$$\begin{aligned}V_{31} &= V_{CC} + A\times\{1/2\,\text{Cos}(\omega_L-\omega_S)t + \\&\quad 1/2\,\text{Cos}(\omega_L+\omega_S)t\} + (R_{32}\times I_{21}/2)\times\text{Cos}\,\omega_L t\end{aligned} \quad (29)$$

$$\begin{aligned}V_{32} &= V_{CC} - A\times\{1/2\,\text{Cos}(\omega_L-\omega_S)t + \\&\quad 1/2\,\text{Cos}(\omega_L+\omega_S)t\} - (R_{32}\times I_{21}/2)\times\text{Cos}\,\omega_L t\end{aligned} \quad (30)$$

-continued $$V_{33} = V_{CC} + A \times \{1/2\cos(\omega_L - \omega_S)t + \\ 1/2\cos(\omega_L + \omega_S)t\} - (R_{32} \times I_{21}/2) \times \cos\omega_L t \quad (31)$$

$$V_{34} = V_{CC} - A \times \{1/2\cos(\omega_L - \omega_S)t + \\ 1/2\cos(\omega_L + \omega_S)t\} + (R_{32} \times I_{21}/2) \times \cos\omega_L t \quad (32)$$

which, when substituted into EQ. 25 and EQ. 26, will yield:

$$V_{37} = (V_{31} + V_{33})/2 \quad (29)$$
$$= V_{CC} - R_{32} \times I_{31}/2 - \\ A \times \{\cos(\omega_L - \omega_S)t + \cos(\omega_L + \omega_S)t\}$$

$$V_{38} = (V_{32} + V_{34})/2 \quad (30)$$
$$= V_{CC} - R_{32} \times I_{31}/2 + \\ A \times \{\cos(\omega_L - \omega_S)t + \cos(\omega_L + \omega_S)t\}$$

Notice that the voltages V37 and V38 are no longer dependent upon the value of the non-linear emitter resistance $r_e$, therefore eliminating the primary source of non-linear distortion.

Figure 4:
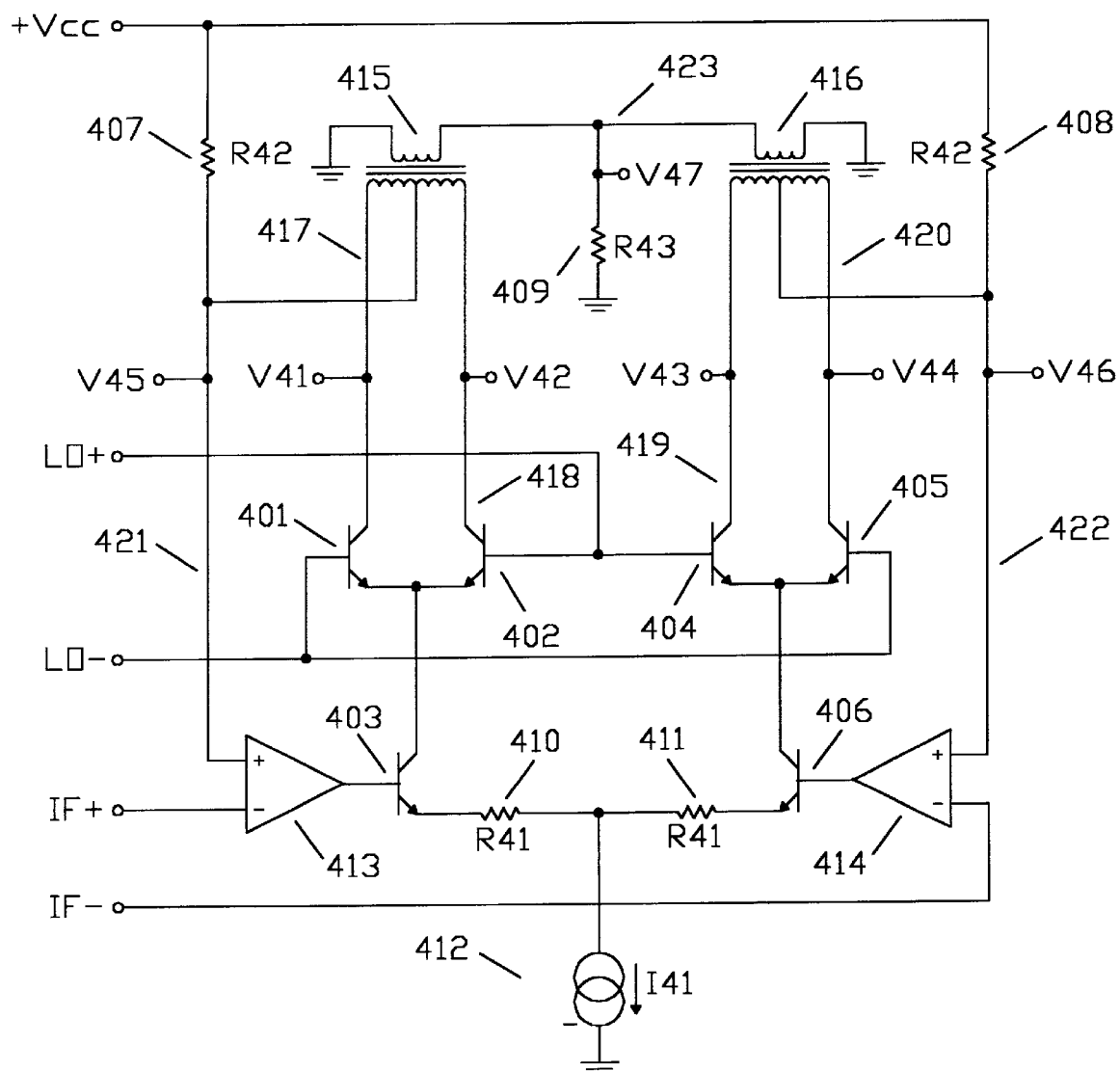
FIG. 4 schematically illustrates the addition of a pair of operational amplifiers and hybrid transformer feedback and signal combiners in the linearized double-balanced active mixer of FIG. 2.

A second method of combining the four collector voltages can be accomplished according to the present invention and is shown in FIG. 4. Here, items 415 and 416 are hybrid transformers which, if both are identical with turns ratios of 1:1:1, will have the following relationships:

$$V_{45}=(V_{41}+V_{42})/2 \quad (35)$$

$$V_{46}=(V_{43}+V_{44})/2 \quad (36)$$

$$V_{47}=(V_{42}-V_{41})/2+(V_{43}-V_{44})/2 \quad (37)$$

Resistors 407 and 408 serve the purpose of providing a proper termination resistance for the center taps of hybrid transformers 415 and 416, and for a transformer turns ratio of 1:1:1 will be of equal value R42, which is related to the load resistance 409 of value R42 by way of the relationship:

$$R_{42}=R_{43}\times 2 \quad (38)$$

As with the circuit of FIG. 3, the operational amplifiers 413 and 414, seeing the differential input signal at their inverting inputs and the voltages V45 and V46 at their respective non-inverting inputs, will force the AC component of these two voltages to be equal to the differential input voltages:

$$V_{45}=+A\times\cos\omega_S t \quad (39)$$

$$V_{46}=-A\times\cos\omega_S t \quad (40)$$

Now, by comparing EQ. 39 and EQ. 40 with EQ. 29 and EQ. 30, and then with EQ. 25, EQ. 26, EQ. 27, and EQ. 28, and making note that the LO signals across the primaries of the hybrid transformers 415 and 416 are of opposite phase and therefore cancel, we can see that:

$$V_{41}=V_{CC}+[A\times\{\tfrac{1}{2}\cos(\omega_L-\omega_S)t+\tfrac{1}{2}\cos(\omega_L+\omega_S)t\}] \quad (41)$$

$$V_{42}=V_{CC}-[A\times\{\tfrac{1}{2}\cos(\omega_L-\omega_S)t+\tfrac{1}{2}\cos(\omega_L+\omega_S)t\}] \quad (42)$$

$$V_{43}=V_{CC}+[A\times\{\tfrac{1}{2}\cos(\omega_L-\omega_S)t+\tfrac{1}{2}\cos(\omega_L+\omega_S)t\}] \quad (43)$$

$$V_{44}=V_{CC}-[A\times\{\tfrac{1}{2}\cos(\omega_L-\omega_S)t+\tfrac{1}{2}\cos(\omega_L+\omega_S)t\}] \quad (44)$$

which, when substituted into EQ. 37 yields:

$$V_{47}=+A\times\{\cos(\omega_L-\omega_S)t+\cos(\omega_L+\omega_S)t\} \quad (45)$$

Notice that, as with FIG. 3, these voltages are no longer dependent upon the value of the nonlinear emitter resistance $r_e$, once again eliminating the primary source of non-linear distortion. Those familiar with the art will recognize that signal gains other than unity can be obtained by the application of appropriate methods associated with operational amplifiers.

Figure 5:
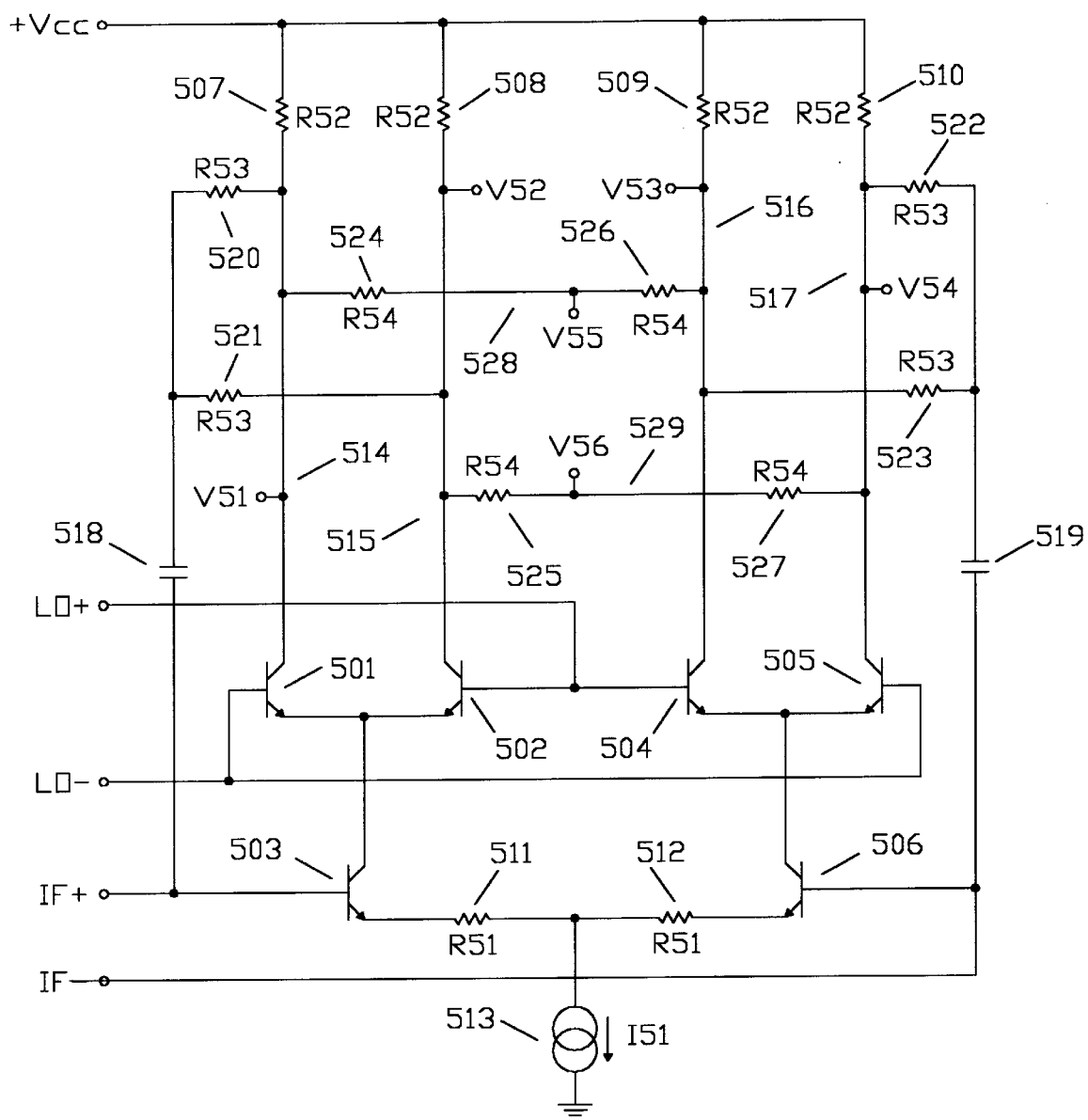
FIG. 5 schematically illustrates the addition of a pair of resistive feedback and resistive output combiners in the linearized double-balanced active mixer of FIG. 2.

In some circumstances the use of an operational amplifier, as shown on FIG. 3 and FIG. 4, may not be suitable for a variety of reasons, of which frequency response would be primary. Instead, alternate means of applying a feedback topology need to be applied. The circuit of FIG. 5 is one such alternative. Here, a pair of series/shunt feedback amplifiers are employed, having been formed in the following manner: On the left-hand side, the emitter of transistor 503 is connected to a series feedback resistor 511, having a value of R51. Resistors 520 and 521, having equal value R53, form the shunt feedback resistance. Capacitor 518 serves as a DC block for biasing purposes. A similar description follows for the right-hand side, where the emitter of transistor 505 is connected to a series feedback resistor 512, also having a value of R51. Resistors 522 and 523, also having equal value R53, form the shunt feedback resistance. Capacitor 519 serves as a DC block for biasing purposes. The four resistors 507, 508, 509, and 510 are present for biasing purposes, and in some cases may be replaced with suitable decoupling chokes. The four collector voltages of transistors 501, 502, 504, and 505 are as follows:

$$V_{51} = V_{CC} + A \times A_V \times \{1/2\cos(\omega_L - \omega_S)t + \\ 1/2\cos(\omega_L + \omega_S)t\} + (R_{52} \times I_{51}/4) \times \cos\omega_L t \quad (46)$$

$$V_{52} = V_{CC} - A \times A_V \times \{1/2\cos(\omega_L - \omega_S)t + \\ 1/2\cos(\omega_L + \omega_S)t\} - (R_{52} \times I_{51}/4) \times \cos\omega_L t \quad (47)$$

$$V_{53} = V_{CC} + A \times A_V \times \{1/2\cos(\omega_L - \omega_S)t + \\ 1/2\cos(\omega_L + \omega_S)t\} - (R_{52} \times I_{51}/4) \times \cos\omega_L t \quad (48)$$

$$V_{54} = V_{CC} - A \times A_V \times \{1/2\cos(\omega_L - \omega_S)t + \\ 1/2\cos(\omega_L + \omega_S)t\} + (R_{52} \times I_{51}/4) \times \cos\omega_L t \quad (49)$$

where $$A_v=1-\sqrt{[R_{53}/(R_{51}+r_e)]} \quad (50)$$

A distinct advantage to this topology is that the IF input impedance at the base terminals of transistors 503 and 506 is constant, having a value of approximately:

$$R_I=\sqrt{[R_{53}\times(R_{51}+r_e)]} \quad (51)$$

The output impedances at the collector terminals of transistors 501, 502, 504, and 505 are:

$$R_O=2\times\sqrt{[R_{53}\times(R_{51}+r_e)]} \quad (52)$$

and by reference to Eq. 25 and Eq. 26, the output voltages at 528 and 529 are, respectively:

$$V_{55} = (V_{51} + V_{53})/2 \quad (53)$$
$$= V_{CC} - (R_{52} \times I_{51}/4) \times \cos\omega_L t - \\ A \times A_V \times \{1/2\cos(\omega_L - \omega_S)t + 1/2\cos(\omega_L + \omega_S)t\}$$

-continued $$V_{38} = (V_{52} + V_{54})/2 \quad (54)$$
$$= V_{CC} - (R_{52} \times I_{51}/4) \times \cos\omega_L t +$$
$$A \times A_V \times \{1/2\cos(\omega_L - \omega_S)t + 1/2\cos(\omega_L + \omega_S)t\}$$

Figure 6:
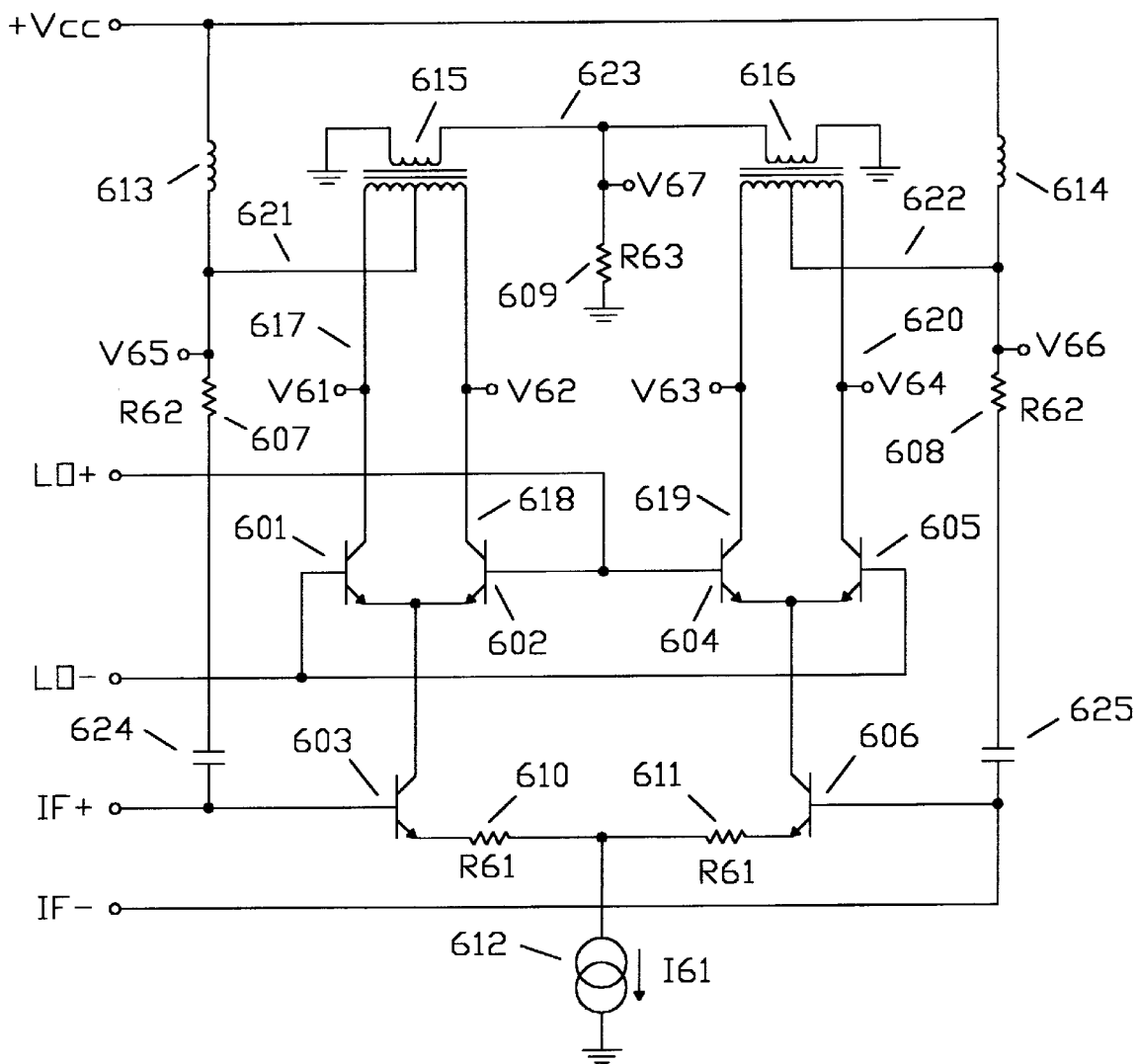
FIG. 6 schematically illustrates the addition of a pair of hybrid transformers and feedback resistors in the linearized double-balanced active mixer of FIG. 2.

The hybrid transformers used un FIG. 4 can also be used with this topology, as is shown in FIG. 6. Here, the output impedance of the series/shunt feedback amplifiers formed on the left by transistor 601 and resistors 607 and 610, and on the right by transistor 606 and resistors 608 and 611, must match the primary center-tap impedances of the two hybrid transformers 615 and 616.

If both hybrid transformers have a turns ratio of 1:1:1, this impedance becomes:

$$R_O = \sqrt{[R_{62} \times (R_{61} + r_e)]} = 2 \times R_{63} \quad (55)$$

Referring to EQ. 35 and EQ. 36, the signals at the center taps of the hybrid transformers, 615 and 616 are, respectively:

$$V_{65} = -A \times A_V \times \cos\omega_S t \quad (56)$$

$$V_{66} = +A \times A_V \times \cos\omega_S t \quad (57)$$

where $$A_V = 1 - \sqrt{[R_{63}/(R_{61} + r_e)]} \quad (58)$$

Comparing EQ. 56 and EQ. 57 with EQ. 35 and EQ. 36, and then with EQ. 41, EQ. 42, EQ. 43, and EQ. 44, we can see that $$V_{61} = V_{CC} + [A \times A_V \times \{\tfrac{1}{2}\cos(\omega_L - \omega_S)t + \tfrac{1}{2}\cos(\omega_L + \omega_S)t\}] \quad (59)$$

$$V_{62} = V_{CC} - [A \times A_V \times \{\tfrac{1}{2}\cos(\omega_L - \omega_S)t + \tfrac{1}{2}\cos(\omega_L + \omega_S)t\}] \quad (60)$$

$$V_{63} = V_{CC} + [A \times A_V \times \{\tfrac{1}{2}\cos(\omega_L - \omega_S)t + \tfrac{1}{2}\cos(\omega_L + \omega_S)t\}] \quad (61)$$

$$V_{64} = V_{CC} - [A \times A_V \times \{\tfrac{1}{2}\cos(\omega_L - \omega_S)t + \tfrac{1}{2}\cos(\omega_L + \omega_S)t\}] \quad (62)$$

and subsequently from EQ. 45, we see that the output signal is:

$$V_{67} = +A \times A_V \times \{\cos(\omega_L - \omega_S)t + \cos(\omega_L + \omega_S)t\} \quad (63)$$

Figure 7:
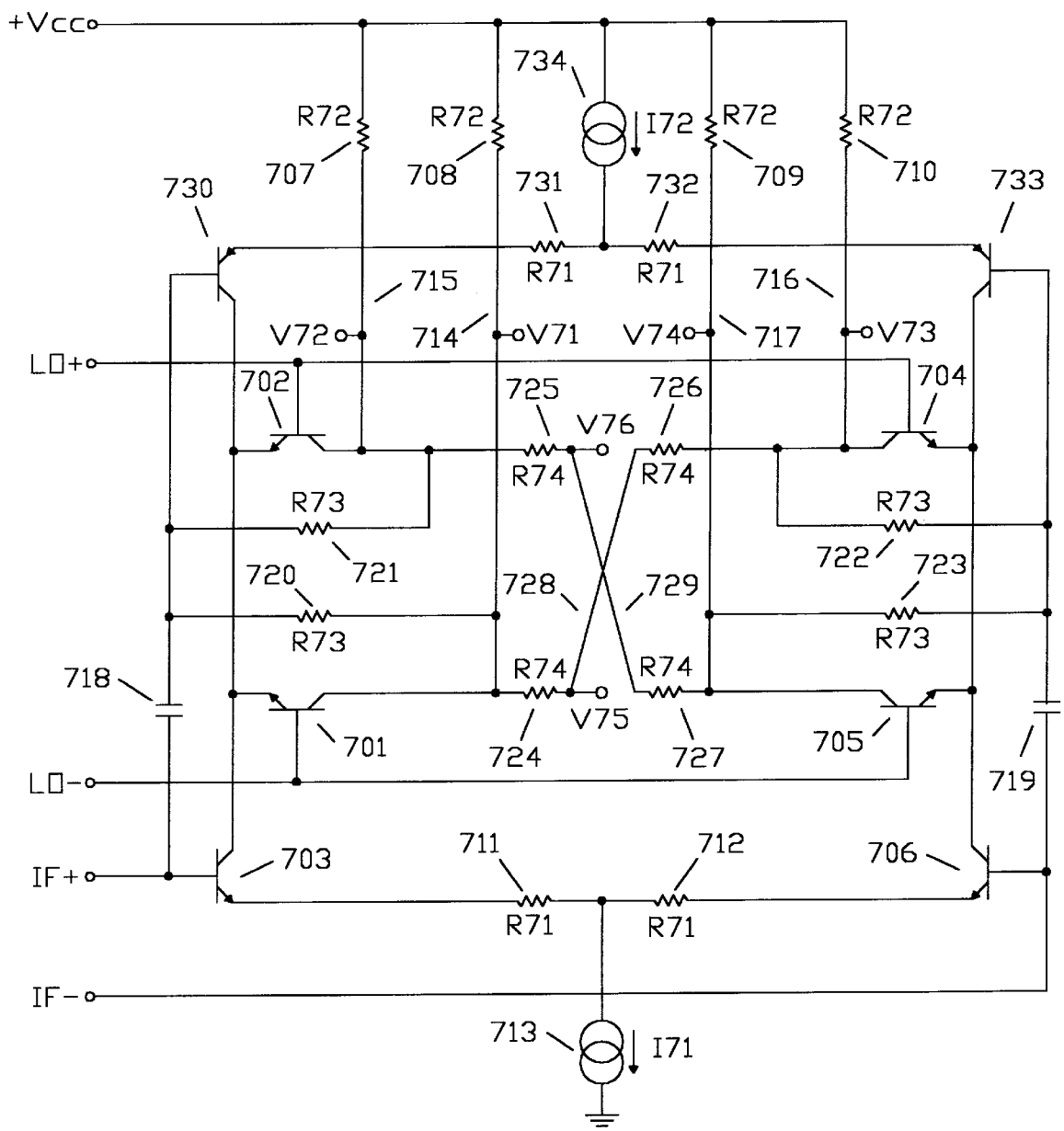
FIG. 7 schematically illustrates the addition of a pair of complementary transistors as a further embodiment of the linearized double-balanced active mixer of FIG. 5.

The IM performance of the circuit of FIG. 5 can be further improved by introducing a complementary PNP transistor to the series/shunt feedback amplifiers, so as to make them functionally push-pull, as is shown in FIG. 7. The development of the output voltages and impedances is the same as for the circuit of FIG. 5, and briefly it can be shown that the IF input impedance at the base terminals of transistors 703 and 706 is:

$$R_I = \sqrt{[R_{73} \times (R_{71} + r_e)]} \quad (64)$$

and the output impedances at the collector terminals of transistors 701, 702, 704, and 705 are:

$$R_O = 2 \times \sqrt{[R_{73} \times (R_{71} + r_e)]} \quad (65)$$

Referring to EQ. 23 and EQ. 24, the output voltages at 728 and 729 are, respectively:

$$V_{75} = V_{CC} - (R_{52} \times I_{51}/4) \times \cos\omega_L t - \quad (66)$$
$$A \times A_V \times \{1/2\cos(\omega_L - \omega_S)t + 1/2\cos(\omega_L + \omega_S)t\}$$

$$V_{76} = V_{CC} - (R_{72} \times I_{71}/4) \times \cos\omega_L t + \quad (67)$$
$$A \times A_V \times \{1/2\cos(\omega_L - \omega_S)t + 1/2\cos(\omega_L + \omega_S)t\}$$

where $$A_V = 1 - \sqrt{[R_{73}/(R_{71} + r_e)]} \quad (68)$$

Figure 8:
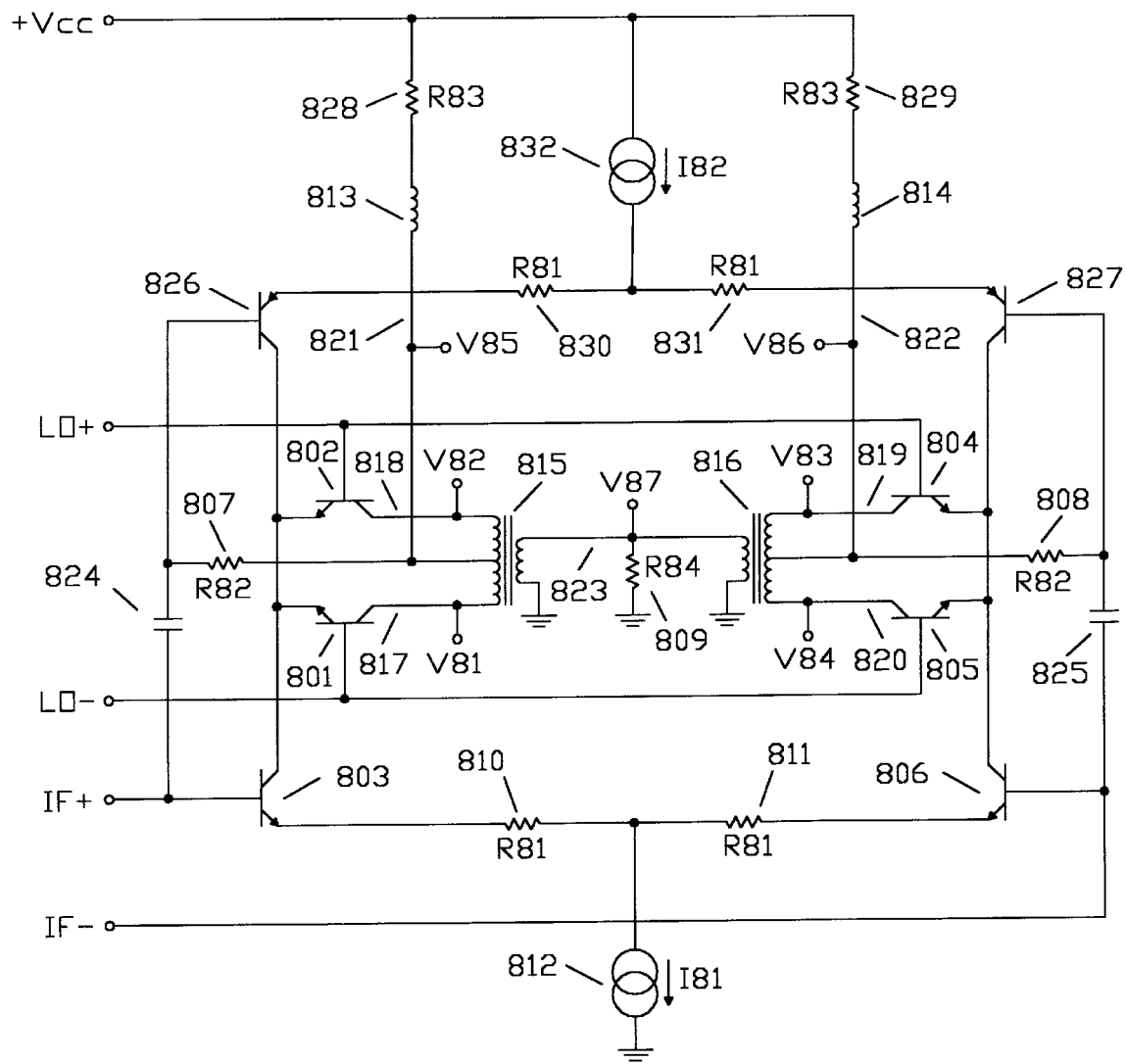
FIG. 8 schematically describes the addition of a pair of complementary transistors as a further embodiment of the linearized double-balanced active mixer of FIG. 6.

In a similar manner, the IM performance of the circuit of FIG. 6 can be further improved by introducing a complementary PNP transistor to the series/shunt feedback amplifiers, so as to make them functionally push-pull, as shown in FIG. 8. The development of the output voltages and impedances is the same as for the circuit of FIG. 6, and briefly it can be shown that the IF input impedance at the base terminals of transistors 803 and 806 is:

$$R_I = \sqrt{[R_{82} \times (R_{81} + r_e)]} \quad (69)$$

and if the ratio of the windings of the hybrid transformers 815 and 816 are 1:1:1, then the output impedances of the two series/shunt amplifiers must satisfy the relationship:

$$R_O = \sqrt{[R_{82} \times (R_{81} + r_e)]} = 2 \times R_{83} \quad (70)$$

The output voltage at 823 is:

$$V_{87} = +A \times A_V \times \{\cos(\omega_L - \omega_S)t + \cos(\omega_L + \omega_S)t\} \quad (71)$$

where $$A_V = 1 - \sqrt{[R_{83}/(R_{81} + r_e)]} \quad (72)$$

Although detailed embodiments of the invention have been described, it should be appreciated that numerous modifications, variations, and adaptations may be made without departing from the scope of the invention as described in the claims. For example, those familiar with the art will recognize that the bipolar transistors shown in the embodiments may be alternatively replaced with field effect transistors. Furthermore, the biasing arrangements shown in the embodiments consisting of a single current source may be replaced with any number of biasing arrangements, including the use of two current sources or a combination of resistors which would provide a passive means of biasing. In addition, the biasing arrangements consisting of collector pull-up resistors may be replaced with any number of biasing means, including current sources.

What is claimed is:

1. A linearized double-balanced active mixer circuit for mixing an input intermediate frequency (IF) signal and an input local oscillator (LO) signal and producing an output radio frequency (RF) signal comprising:

a first pair of input terminals for receiving a differential first and second IF input signal;

a second pair of input terminals for receiving a differential first and second LO input signal;

a pair of output terminals for providing a first and second RF output signal;

a first linearized balanced active mixer circuit having an IF input connected to the first IF signal input terminal of the linearized double-balanced active mixer circuit, a differential first and second LO input connected to the differential first and second LO signal input terminals of the linearized double-balanced active mixer circuit, a differential first and second RF output, and a feedback input;

a second linearized balanced active mixer circuit having an IF input connected to the second IF signal input terminal of the linearized double-balanced active mixer circuit, a differential first and second LO input connected to the differential first and second LO signal input terminals of the linearized double-balanced active mixer circuit, a differential first and second RF output, and a feedback input; and a signal combiner circuit having a first pair of differential first and second RF inputs connected to the differential first and second RF outputs of the first linearized balanced active mixer circuit, a second pair of differential third and fourth RF inputs connected to the differential first and second RF outputs of the second linearized balanced active mixer circuit, a first feedback output connected to the feedback input of the first linearized balanced active mixer circuit, a second feedback output connected to the feedback input of the second linearized balanced active mixer circuit, and a pair of first and second RF outputs connected to the first and second RF output terminals of the linearized double-balanced active mixer circuit.

2. A linearized double-balanced active mixer circuit, as claimed in claim 1, wherein the signal combiner circuit further comprises:

a first feedback signal combiner circuit comprising a pair or resistors of equal value, the first resistor connected from the first RF input of the first differential RF input of the signal combiner circuit to the first feedback output of the signal combiner circuit, and the second resistor connected from the second RF input of the first differential RF input of the signal combiner circuit to the first feedback output of the signal combiner circuit;

a second feedback signal combiner circuit comprising a pair of resistors of equal value, the first resistor connected from the third RF input of the second differential RF input of the signal combiner circuit to the second feedback output of the signal combiner circuit, and the second resistor connected from the fourth RF input of the second differential RF input of the signal combiner circuit to the second feedback output of the signal combiner circuit;

a first output signal combiner circuit comprising a pair of resistors of equal value, the first resistor connected from the first RF input of the first differential RF input of the signal combiner circuit to the first RF output of the signal combiner circuit, and the second resistor connected from the third RF input of the second differential RF input of the signal combiner circuit to the first RF output of the signal combiner circuit; and a second output signal combiner circuit comprising a pair of resistors of equal value, the first resistor connected from the second RF input of the first differential RF input of the signal combiner circuit to the second RF output of the signal combiner circuit, and the second resistor connected from the fourth RF input of the second differential RF input of the signal combiner circuit to the second RF output of the signal combiner circuit.

3. A linearized double-balanced active mixer circuit, as claimed in claim 1, wherein the signal combiner circuit further comprises:

a first feedback signal combiner circuit comprising the center-tapped primary winding of a first hybrid transformer, the first primary input connected to the first RF input of the first differential RF input of the signal combiner circuit, the second primary input connected to the second RF input of the first differential RF input of the signal combiner circuit, and the primary center-tap connected to the first feedback output of the signal combiner circuit;

a second feedback signal combiner circuit comprising the center-tapped primary winding of a second hybrid transformer, the first primary input connected to the third RF input of the second differential RF input of the signal combiner circuit, the second primary input connected to the fourth RF input of the second differential RF input of the signal combiner circuit, and the primary center-tap connected to the second feedback output of the signal combiner;

a first output signal combiner circuit comprising secondary winding of the said first hybrid transformer, the first secondary output connected to signal ground and the second RF output terminal of the signal combiner circuit, and the second secondary output connected to the first RF output of the signal combiner circuit; and a second output signal combiner circuit comprising the secondary winding of the said second hybrid transformer, the first secondary output connected to the first RF output of the signal combiner circuit, and the second secondary output connected to signal ground and the second RF output of the signal combiner circuit.

4. A linearized double-balanced active mixer circuit, as claimed in claim 2, wherein the linearized balanced active mixer circuits further comprise a differential pair of switching transistors, an operational amplifier, and an amplifying transistor, the base of the said amplifying transistor connected to the output of the said operational amplifier, the collector of the said amplifying transistor being connected to the common emitter connection of the said differential transistor pair, the emitter of the said amplifying transistor connected to a common point, such as ground, the collectors of the said differential transistor pair connected to a pair of differential first and second RF outputs, the bases of the said differential transistor pair connected to a differential pair of LO inputs, the noninverting input of the said operational amplifier connected to an IF input, and the non-inverting input of the said operational amplifier connected to a feedback input.

5. A linearized double-balanced active mixer circuit, as claimed in claim 2, wherein the linearized balanced active mixer circuits further comprise a differential pair of switching transistors and an amplifying transistor, the collector of the said amplifying transistor being connected to the common emitter connection of the said differential transistor pair, the emitter of the said amplifying transistor connected to a series feedback resistor, the other end of the said series feedback resistor connected to a common point, such as ground, the collectors of the said differential transistor pair connected to a differential first and second RF output, the bases of the said differential transistor pair connected to a differential pair of LO inputs, and the base of the said amplifying transistor connected to an IF input and a feedback input.

6. A linearized double-balanced active mixer circuit, as claimed claim 2, wherein the linearized balanced active mixer circuits further comprise a differential pair of switching transistors and a complementary push-pull amplifier consisting of a first amplifying NPN transistor and a second amplifying PNP transistor, the emitter of the said first amplifying NPN transistor connected to a first series feedback resistor, the other end of the said first series feedback resistor connected to a common point, such as ground, the emitter of the said second amplifying PNP transistor connected to a second series feedback resistor, the other end of the said second series feedback resistor connected to the common point, the collector of the said first amplifying NPN transistor and the collector of the said second amplifying PNP transistor connected to the common emitter connection of the said differential transistor pair, the collectors of the said differential transistor pair connected to a differential first and second RF output, the base of the said first amplifying NPN transistor connected in common to the base of the said second amplifying PNP transistor, and the common-connected bases of the said two amplifying transistors connected to an IF input and a feedback input.

7. A linearized double-balanced active mixer circuit, as claimed in claim 3, wherein the linearized balanced active mixer circuits further comprise a differential pair of switching transistors, an operational amplifier, and an amplifying transistor, the base of the said amplifying transistor connected to the output of the said operational amplifier, the collector of the said amplifying transistor being connected to the common emitter connection of the said differential transistor pair, the emitter of the said amplifying transistor connected to a common point, such as ground, the collectors of the said differential transistor pair connected to a differential pair of first and second RF outputs, the noninverting input of the said operational amplifier connected to an IF input, the inverting input of the said operational amplifier connected to a feedback input, and a resistor connected from the feedback input to the common point.

8. A linearized double-balanced active mixer circuit, as claimed in of claim 3, wherein the linearized balanced active mixer circuits further comprise a differential pair of switching transistors and an amplifying transistor, the collector of the said amplifying transistor being connected to the common emitter connection of the said differential transistor pair, the emitter of the said amplifying transistor connected to a series feedback resistor, the other end of the said series feedback resistor connected to a common point, such as ground, the collectors of the said differential transistor pair connected to a differential first and second RF output, the base of the said amplifying transistor connected to an IF input and the first end of a shunt feedback resistor, and the second end of the said shunt feedback resistor connected to a feedback input.

9. A linearized double-balanced active mixer circuit, as claimed in claim 3, wherein the linearized balanced active mixer circuits further comprise a differential pair of switching transistors and a complementary push-pull amplifier consisting of a first amplifying NPN transistor and a second amplifying PNP transistor, the emitter of the said first amplifying NPN transistor connected to a first series feedback resistor, the other end of the said first series feedback resistor connected to a common point, such as ground, the emitter of the said second amplifying PNP transistor connected to a second series feedback resistor, the other end of the said second series feedback resistor connected to the common point, the collector of the said first amplifying NPN transistor and the collector of the said second amplifying PNP transistor being connected to the common emitter connection of the said differential transistor pair, the collectors of the said differential transistor pair connected to a differential first and second RF output, the base of the said first amplifying NPN transistor connected in common to the base of the said second amplifying PNP transistor, the common-connected bases of the said amplifying transistors connected to an IF input and the first end of a shunt feedback resistor, and the second end of the said shunt feedback resistor connected to a feedback input.

10. A method of combining an input intermediate frequency (IF) signal and an input local oscillator (LO) signal and providing a linearized output radio frequency (RF) signal comprising the steps of:

providing a differential first and second IF input signal;

providing a differential LO input signal;

combining the first IF input signal and the differential LO input signal by a mixing means and producing a differential first and second RF signal;

combining the second IF input signal and the differential LO input signal by a mixing means and producing a differential third and fourth RF signal;

combining the first and second RF signals by a summation means and producing a first feedback signal;

combining the third and fourth RF signals by a summation means and producing a second feedback signal;

combining the first, second, third, and fourth RF signals by a summation and differencing means and producing an RF output signal;

combining the first feedback signal with the first IF input signal and providing a correction for linearizing the first and second differential RF signals; and combining the second feedback signal with the second IF input signal and providing a correction for linearizing the third and fourth differential RF signals.

* * * * *